United States Patent
Li et al.

(10) Patent No.: US 9,238,733 B2
(45) Date of Patent: Jan. 19, 2016

(54) HALOGEN-FREE RESIN COMPOSITION

(71) Applicant: ELITE ELECTRONIC MATERIAL (ZHONGSHAN) CO., LTD, ZhongShan, Guangdong Province (CN)

(72) Inventors: Chang-Yuan Li, ZhongShan (CN); Li-Ming Chou, Tao-Yuan Hsien (TW); Li-Chih Yu, Tao-Yuan Hsien (TW); Tse-An Lee, Tao-Yuan Hsien (TW)

(73) Assignee: ELITE ELECTRONIC MATERIAL (ZHONGSHAN) CO., LTD., Guangdong Province (CN)

( * ) Notice: Subject to any disclaimer, the term of this patent is extended or adjusted under 35 U.S.C. 154(b) by 18 days.

(21) Appl. No.: 13/679,714

(22) Filed: Nov. 16, 2012

(65) Prior Publication Data
US 2013/0316155 A1 Nov. 28, 2013

(30) Foreign Application Priority Data
May 22, 2012 (CN) .......................... 2012 1 0160820

(51) Int. Cl.
| | |
|---|---|
| B32B 27/38 | (2006.01) |
| C08L 63/00 | (2006.01) |
| C08L 37/00 | (2006.01) |
| B32B 15/092 | (2006.01) |
| B32B 3/10 | (2006.01) |
| C08L 65/00 | (2006.01) |
| B32B 5/02 | (2006.01) |
| B32B 15/14 | (2006.01) |
| B32B 15/20 | (2006.01) |
| C08J 5/24 | (2006.01) |
| C08L 79/02 | (2006.01) |
| C08G 73/02 | (2006.01) |
| C08L 61/00 | (2006.01) |
| H05K 1/03 | (2006.01) |

(52) U.S. Cl.
CPC . *C08L 63/00* (2013.01); *B32B 3/10* (2013.01); *B32B 5/022* (2013.01); *B32B 5/024* (2013.01); *B32B 15/092* (2013.01); *B32B 15/14* (2013.01); *B32B 15/20* (2013.01); *C08J 5/24* (2013.01); *C08L 37/00* (2013.01); *C08L 65/00* (2013.01); *B32B 2260/021* (2013.01); *B32B 2260/046* (2013.01); *B32B 2262/101* (2013.01); *B32B 2307/204* (2013.01); *B32B 2307/306* (2013.01); *B32B 2307/3065* (2013.01); *B32B 2457/08* (2013.01); *C08G 73/0233* (2013.01); *C08J 2363/00* (2013.01); *C08L 61/00* (2013.01); *C08L 79/02* (2013.01); *C08L 2205/035* (2013.01); *H05K 1/0353* (2013.01); *H05K 1/0373* (2013.01); *H05K 2201/0209* (2013.01); *Y10T 428/24917* (2015.01); *Y10T 428/31529* (2015.04)

(58) Field of Classification Search
None
See application file for complete search history.

(56) References Cited

U.S. PATENT DOCUMENTS

| | | | |
|---|---|---|---|
| 6,440,567 B1 | 8/2002 | Choate et al. | |
| 7,255,925 B2 | 8/2007 | Chung et al. | |
| 2009/0156715 A1* | 6/2009 | Dueber et al. | ................. 524/100 |
| 2010/0292415 A1* | 11/2010 | Reynolds et al. | ...... C08G 59/24 525/533 |
| 2011/0053447 A1* | 3/2011 | Su et al. | ........................ 442/147 |

FOREIGN PATENT DOCUMENTS

EP 0763566 A1 3/1997

OTHER PUBLICATIONS

R.B. Durairaj, "Resorcinol: Chemistry Technology and Applications", p. 604. 2005.*
Momentive: DCPD-Phenol Adducts. Retrieved on Apr. 11, 2014. http://www.momentive.com/products/main.aspx?id=7660.*

* cited by examiner

*Primary Examiner* — Coris Fung
(74) *Attorney, Agent, or Firm* — WPAT, P.C.; Anthony King

(57) ABSTRACT

A halogen-free resin composition includes 100 parts by weight of epoxy resin; 10 to 100 parts by weight of benzoxazine resin; 10 to 100 parts by weight of styrene-maleic anhydride copolymer; and 10 to 90 parts by weight of dicyclopentadiene phenol novolac resin. The halogen-free resin composition features specific ingredients and proportions thereof to attain low dielectric constant (Dk), low dielectric dissipation factor, high heat resistance and high non-flammability and produce prepregs or resin film, and is thus applicable to copper clad laminates and printed circuit boards.

7 Claims, No Drawings

HALOGEN-FREE RESIN COMPOSITION

CROSS-REFERENCE TO RELATED APPLICATION

This non-provisional application claims priority under 35 U.S.C. §119(a) on Patent Application No(s). 201210160820.8 filed in China on May 22, 2012, the entire contents of which are hereby incorporated by reference.

FIELD OF THE INVENTION

The present invention relates to halogen-free resin compositions, and more particularly, to a halogen-free resin composition for use with copper clad laminates and printed circuit boards.

BACKGROUND OF THE INVENTION

To get in line with the global trend of environmental protection and eco-friendly regulations, electronic product manufacturers nowadays are developing and manufacturing halogen-free electronic products. Advanced countries and electronic manufacturing giants set forth schedules of launching mass production of halogen-free electronic products. As a result of the promulgation of the Restriction of Hazardous Substances (RoHS) by the European Union, hazardous substances, such as lead, cadmium, mercury, hexavalent chromium, poly-brominated biphenyl (PBB), and poly-brominated diphenyl ether (PBDE), are strictly prohibited from being used in manufacturing electronic products or their parts and components. A printed circuit board (PCB) is an indispensable and fundamental basis of the semiconductor industry and electronic industry; hence, printed circuit boards bore the brunt of international halogen-free regulations when international organizations set forth strict requirements of the halogen content of printed circuit boards. For example, the International Electrotechnical Commission (IEC) 61249-2-21 requires that bromine content and chloride content shall be less than 900 ppm and the total halogen content shall be less than 1500 ppm. The Japan Electronics Packaging and Circuits Association (JPCA) requires that both bromide content and chloride content shall be less than 900 ppm. To enforce its green policies, Greenpeace calls on manufacturers worldwide to get rid of polyvinyl chloride (PVC) and brominated flame retardants (BFRs) from their electronic products in order to conform with the lead-free and halogen-free requirements of green electronics. Hence, the industrial sector nowadays is interested in rendering related materials halogen-free and sees this technique as one of its key research topics.

Electronic products nowadays have the trend toward compactness and high-frequency transmission; hence, circuit boards nowadays typically feature a high-density layout and increasingly strict material requirements. To mount high-frequency electronic components on a circuit board, it is necessary that the substrate of the circuit board is made of a material of a low dielectric constant (Dk) and dielectric dissipation factor (Df) in order to maintain the transmission speed and the integrity of a signal transmitted. To allow the electronic components to function well at a high temperature and a high-humidity environment, it is necessary for the circuit board to be heat resistant, fire resistant, and of low hygroscopicity. Epoxy resin is adhesive, heat resistant, and malleable and thus is widely applicable to encapsulants and copper clad laminates (CCL) of electronic components and machinery. From the perspective of fire prevention, epoxy resin is incapable of flame retardation, and thus epoxy resin has to acquire flame retardation capability by including a flame retardant therein. For example, a halogen, such as bromine, is included in epoxy resin to bring about flame retardation capability thereof.

Recent years see electronic products becoming lighter and smaller and circuits becoming finer, thereby disadvantaging heavy halogen compounds. When exposed to a high temperature for a long period of time, a halogen compound is likely to decompose and thereby erode a fine circuit. Furthermore, combustion of discarded used electronic parts and components produces hazardous compounds, such as halogen compounds, which are environmentally unfriendly. To find an alternative to the aforesaid halogen compound-based flame retardant, researchers attempt to use a phosphorus compound as a flame retardant, for example, adding phosphate ester (U.S. Pat. No. 6,440,567) or red phosphorus (EP patent No. 0763566) to an epoxy resin composition. However, phosphate ester undergoes hydrolysis readily to produce an acid, thereby compromising its tolerance to migration. Although red phosphorus is good at flame retardation, it falls into the category of hazardous compounds under the firefighting law, because it produces a trace of a flammable, toxic gas known as phosphine in a warm humid environment.

A conventional circuit board manufacturing method, such as a conventional method of manufacturing a copper-clad substrate (also known as copper clad laminate, CCL), involves heating and combining a reinforcement material (such as a glass fabric) and a thermosetting resin composition made of an epoxy resin and a curing agent to form a prepreg, and then laminating the prepreg and the upper and lower copper foils together at a high temperature and a high pressure. The prior art usually teaches using a thermosetting resin composed of an epoxy resin and a hydroxyl-containing phenol novolac resin curing agent. Due to the combination of the phenol novolac resin and the epoxy resin, epoxide ring-opening reactions end up with another hydroxyl which not only increases the dielectric constant (Dk) and the dielectric dissipation factor inherently, but also reacts with water readily and thereby renders the thermosetting resin more hygroscopic.

U.S. Pat. No. 7,255,925 discloses a thermosetting resin composition composed of cyanate ester resin, dicyclopentadiene (DCPD) epoxy resin, silica, and a thermoplastic resin. The thermosetting resin composition is characterized by a low dielectric constant (Dk) and a low dielectric dissipation factor. However, a method for manufacturing the thermosetting resin composition of U.S. Pat. No. 7,255,925 requires the use of a halogen-containing (such as bromine-containing) flame retardant, such as tetrabromocyclohexane, hexabromocyclodecane, or 2,4,6-tris(tribromophenoxy)-1,3,5-triazine. However, the bromine-containing flame retardant causes environmental pollution readily during the thermosetting resin composition manufacturing process, the using processing of thermosetting resin composition, and even after the thermosetting resin composition has been discarded or recycled. To ensure a low dielectric dissipation factor, low hygroscopicity, high cross-linking density, high glass transition temperature, high connectivity, appropriate thermal expansion, heat resistance, and fire resistance of copper clad laminates, it is necessary to select an epoxy resin, a curing agent, and a reinforcement material carefully.

The major considerations given to electrical properties include the dielectric constant (Dk) and the dielectric dissipation factor. In general, the signal transmission speed of a substrate is inversely proportional to the square root of the dielectric constant (Dk) of the material from which the substrate is made, and thus the minimization of the dielectric constant (Dk) of the substrate material is usually advantageously important. The lower the dielectric dissipation factor is, the lesser the signal transmission attenuation is; hence, a material of a low dielectric dissipation factor provides satisfactory transmission quality.

Accordingly, it is important for printed circuit board material suppliers to develop materials of a low dielectric constant (Dk) and a low dielectric dissipation factor, and apply the materials to high-frequency printed circuit board manufacturing.

SUMMARY OF THE INVENTION

In view of the aforesaid drawbacks of the prior art, the inventor of the present invention conceived room for improvement in the prior art and thus conducted extensive researches and experiments according to the inventor's years of experience in the related industry, and finally developed a halogen-free resin composition as disclosed in the present invention to achieve a low dielectric constant (Dk), high heat resistance, and high non-flammability.

It is an objective of the present invention to provide a halogen-free resin composition comprising specific ingredients and characterized by specific proportions thereof so as to achieve a low dielectric constant (Dk), a low dielectric dissipation factor, high heat resistance, and high non-flammability. The halogen-free resin composition is suitable for producing a prepreg or resin film and thus applicable to copper clad laminates and printed circuit boards.

In order to achieve the above and other objectives, the present invention provides a halogen-free resin composition that comprises: (A) 100 parts by weight of epoxy resin; (B) 10 to 100 parts by weight of benzoxazine resin; (C) 10 to 100 parts by weight of styrene-maleic anhydride (SMA) copolymer; and (D) 10 to 90 parts by weight of dicyclopentadiene (DCPD) phenol novolac resin.

As regards its purpose, the halogen-free resin composition is applicable to the manufacturing of prepregs, resin film, copper clad laminates, and printed circuit boards. The halogen-free resin composition of the present invention comprises specific ingredients which is of specific proportions, so as to achieve a low dielectric constant (Dk), a low dielectric dissipation factor, high heat resistance, and high non-flammability. The halogen-free resin composition of the present invention is suitable for producing prepregs or resin film and thus is applicable to copper clad laminates and printed circuit boards.

As regards a halogen-free resin composition of the present invention, the ingredient (A) epoxy resin is one, or a combination, of: bisphenol A epoxy resin, bisphenol F epoxy resin, bisphenol S epoxy resin, bisphenol AD epoxy resin, phenol novolac epoxy resin, bisphenol A novolac epoxy resin, bisphenol F novolac epoxy resin, o-cresol novolac epoxy resin, trifunctional epoxy resin, tetrafunctional epoxy resin, multifunctional epoxy resin, dicyclopentadiene (DCPD) epoxy resin, phosphorus-containing epoxy resin, DOPO epoxy resin, DOPO-HQ epoxy resin, p-xylene epoxy resin, naphthalene epoxy resin, benzopyran (benzopyran) epoxy resin, biphenyl novolac epoxy resin, isocyanate modified epoxy resin, phenol benzaldehyde epoxy resin, and phenol aralkyl novolac epoxy resin. In this regard, DOPO epoxy resin is DOPO-PN epoxy resin, DOPO-CNE epoxy resin, or DOPO-BPN epoxy resin. DOPO epoxy resin is DOPO-HQ-PN epoxy resin, DOPO-HQ-CNE epoxy resin, or DOPO-HQ-BPN epoxy resin.

As regards a halogen-free resin composition of the present invention, the ingredient (B) benzoxazine resin comprises bisphenol A benzoxazine resin, bisphenol F benzoxazine resin, and phenolphthalein benzoxazine resin. Specifically speaking, the ingredient (B) benzoxazine resin preferably includes at least one of the following:

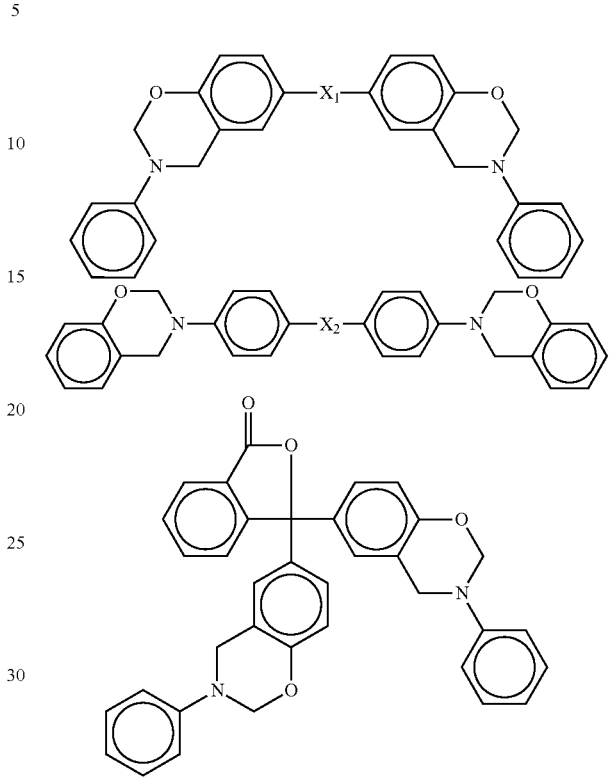

where $X_1$ denotes R, Ar, or —$SO_2$—, and $X_2$ denotes R, Ar, or —$SO_2$—. R is one of —$C(CH_3)_2$—, —$CH(CH_3)$—, —$CH_2$— and substituted or unsubstituted bis(pentamethylcyclopentadienyl). Ar is one of substituted or unsubstituted benzene, diphenyl, naphthalene, phenol novolac, bisphenol A, bisphenol A phenol novolac, bisphenol F, and bisphenol F phenol novolac. For example, the brand names of the aforesaid benzoxazine resin include LZ-8280 and LZ-8290 which are marketed by Huntsman. The additive added to the benzoxazine resin of the halogen-free resin composition of the present invention is one of the above-mentioned or a combination thereof.

As regards a halogen-free resin composition of the present invention, given 100 parts by weight of epoxy resin, 10 to 100 parts by weight of benzoxazine resin is added thereto, wherein the content of the benzoxazine resin thus added allows the halogen-free resin composition to achieve a low dielectric dissipation factor (Df) as expected. If less than 10 parts by weight of benzoxazine resin is added, the expected low dielectric dissipation factor will not be achieved. If more than 100 parts by weight of benzoxazine resin is added, the heat resistance of the substrate produced from the resin composition deteriorated. Specifically speaking, preferably, 10 to 80 parts by weight of benzoxazine resin is added in order to prepare the aforesaid halogen-free resin composition of the present invention.

As regards a halogen-free resin composition of the present invention, the proportion of styrene (S) to maleic anhydride (MA) in the ingredient (C) styrene-maleic anhydride copolymer is 1/1, 2/1, 3/1, 4/1, 6/1 or 8/1. The brand names of styrene-maleic anhydride copolymer include SMA-1000, SMA-2000, SMA-3000, EF-30, EF-40, EF-60, and EF-80 which are marketed by Sartomer. Furthermore, the aforesaid styrene-maleic anhydride copolymer is also an esterized styrene-maleic anhydride copolymer whose brand names include SMA1440, SMA17352, SMA2625, SMA3840 and SMA31890, for example. As regards a halogen-free resin composition of the present invention, the additive of styrene-maleic anhydride copolymer is one of the above-mentioned or a combination thereof.

As regards a halogen-free resin composition of the present invention, given 100 parts by weight of epoxy resin, 10 to 100 parts by weight of styrene-maleic anhydride copolymer is added thereto, wherein the content of the styrene-maleic anhydride copolymer thus added allows the halogen-free resin composition to achieve a low dielectric constant (Dk) as expected. If less than 10 parts by weight of styrene-maleic anhydride copolymer is added, the expected low dielectric constant (Dk) will not be achieved. If more than 100 parts by weight of styrene-maleic anhydride copolymer is added, a prepreg produced from the resin composition will have unattractive appearance and surface picking, thereby reducing the conforming rate of the prepreg production process. Specifically speaking, As regards a halogen-free resin composition of the present invention, preferably, 10 to 50 parts by weight of styrene-maleic anhydride copolymer is added.

As regards a halogen-free resin composition of the present invention, the ingredient (D) dicyclopentadiene phenol novolac resin is a phenol novolac resin that features a dicyclopentadiene structure. For example, the brand names of dicyclopentadiene phenol novolac resin include SD-1806, SD-1809, and SD-1819 which are marketed by Momentive.

As regards a halogen-free resin composition of the present invention, given 100 parts by weight of epoxy resin, 10 to 90 parts by weight of dicyclopentadiene phenol novolac resin is added, wherein the content of the dicyclopentadiene phenol novolac resin thus added allows the halogen-free resin composition to achieve excellent cross-linking, increase glass transition temperature Tg, and increase the tension between the resin and the copper foil. In case of less than 10 parts by weight of dicyclopentadiene phenol novolac resin, the halogen-free resin composition will not manifest the anticipated levels of cross-linking and enhancement of glass transition temperature Tg and the tension of copper foil. In case of more than 90 parts by weight of dicyclopentadiene phenol novolac resin, the substrate produced from the resin composition is characterized by decreased heat resistance, increased hygroscopicity, and deterioration of substrate physical properties. Specifically speaking, as regards a halogen-free resin composition of the present invention, preferably, 15 to 50 parts by weight of dicyclopentadiene phenol novolac resin is added.

The halogen-free resin composition of the present invention further comprises a halogen-free flame retardant. The halogen-free flame retardant is a nitrogen-containing flame retardant or a phosphorus-containing flame retardant. A compound added selectively to the aforesaid halogen-free flame retardant includes, but is not limited to, at least one of the following: bisphenol diphenyl phosphate, ammonium polyphosphate, hydroquinone bis-(diphenyl phosphate), bisphenol A bis-(diphenylphosphate), tri(2-carboxyethyl)phosphine (TCEP), tris(chloroisopropyl) phosphate, trimethyl phosphate (TMP), dimethyl methyl phosphonate (DMMP), resorcinol dixylenyl phosphate (RDXP, such as PX-200), phosphazene (such as SPB-100), m-phenylene methylphosphonate (PMP), melamine polyphosphate, melamine cyanurate, and tri-hydroxy ethyl isocyanurate. Furthermore, the halogen-free flame retardant contains 9,10-dihydro-9-oxa-10-phosphaphenanthrene-10-oxide (DOPO), DOPO-containing phenol resin (such as DOPO-HQ, DOPO-PN, or DOPO-BPN), DOPO-containing epoxy resin, and/or DOPO-HQ epoxy resin, wherein DOPO-BPN is a bisphenol phenol novolac compound, such as DOPO-BPAN, DOPO-BPFN, or DOPO-BPSN.

As regards a halogen-free resin composition of the present invention, given 100 parts by weight of epoxy resin, 10 to 100 parts by weight of a halogen-free flame retardant is added thereto, wherein the content of the halogen-free flame retardant thus added allows the halogen-free resin composition to effectuate flame retardation. If less than 10 parts by weight of halogen-free flame retardant is added, flame retardation will not be achieved. If more than 100 parts by weight of halogen-free flame retardant is added, hygroscopicity will increase, and the substrate will demonstrate deteriorated heat resistance.

The halogen-free resin composition of the present invention further comprises an inorganic filler, a curing accelerator, a silane coupling agent, a toughening agent, a solvent, and/or a combination thereof.

As regards a halogen-free resin composition of the present invention, an inorganic filler thus added thereto increases the thermal conductivity of the resin composition and enhances its thermal expansion and mechanical strength. Preferably, the inorganic filler is uniformly distributed in the resin composition. The inorganic filler comprises silicon dioxide (existing in a molten state or a non-molten state, or featuring a porous structure or a hollow-core structure), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcinated talcum, talcum, silicon nitride, and/or calcinated china clay. The inorganic filler comes in the form of a spherical shape, a fiber-like shape, board-like shape, particulate shape, strip-like shape, or needle-like shape, and is selectively pre-treated with a silane coupling agent.

The particulate-shaped inorganic filler consists of particulate powder of a diameter of less than 100 μm, or preferably a diameter of 1 nm to 20 μm, or most preferably a diameter of less than 1 μm, i.e., nanoscale particulate powder. The needle-shaped inorganic filler consists of particles each having a diameter of less than 50 μm and a length of 1 to 200 μm.

As regards a halogen-free resin composition of the present invention, given 100 parts by weight of epoxy resin, 10 to 1000 parts by weight of the inorganic filler is added thereto. If less than 10 parts by weight of the inorganic filler is added, halogen-free resin composition will not manifest significant capability of heat conduction, enhanced thermal expansion, or enhanced mechanical strength. If more than 1000 parts by weight of the inorganic filler is added, the resin composition will manifest deteriorated pore-filling mobility and deteriorated adhesion of copper foil.

According to the present invention, the aforesaid a curing accelerator comprise a catalysts, such as a Lewis base or a Lewis acid. The Lewis base includes imidazole, boron trifluoride amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP), and/or 4-dimethylaminopyridine (DMAP). The Lewis acid comprises a metal salt compound, such as a manganese, iron, cobalt, nickel, copper, or zinc metal salt compound, for example, a metal catalyst, such as zinc caprylate, or cobalt caprylate.

The silane coupling agent of the present invention comprises silane and siloxane, and, when categorized according to a functional group, includes amino silane, amino siloxane, epoxy silane, and epoxy siloxane.

The aforesaid toughening agent of the present invention comprises one selected from the group consisting of rubber resin, carboxyl-terminated butadiene acrylonitrile (CTBN) rubber, and core-shell rubber.

The aforesaid solvent of the present invention comprises one selected from the group consisting of methanol, ethanol, ethylene glycol monomethyl ether, acetone, methyl ethyl ketone (MEK), methyl isobutyl ketone (MIBK), cyclohexanone, toluene, xylene, methoxyethyl acrylate, ethoxyethyl acrylate, propoxyethyl acrylate, ethyl acetate, dimethylformamide, propylene glycol methyl ether, and a mixture thereof.

The aforesaid halogen-free resin composition of the present invention further comprises one of phenol resin, phenol novolac resin, polyphenylene ether resin, cyanate ester resin, isocyanate ester resin, maleimide resin, polyester resin, styrene resin, butadiene resin, phenoxy resin, polyamide resin, and polyimide resin, or a combination thereof.

Yet another objective of the present invention is to provide a prepreg. The prepreg has a low dielectric constant (Dk), a low dielectric dissipation factor, heat resistant fire resistance, low hygroscopicity, and halogen-free characteristics. Accordingly, the prepreg of the present invention comprises a reinforcement material and the aforesaid halogen-free resin composition, wherein the halogen-free resin composition is attached to the reinforcement material by means of impregnation, and heated up at a high temperature to be semi-cured. The reinforcement material, which is a fibrous material, a woven fabric, or a non-woven fabric, such as a glass fabric, enhances the mechanical strength of the prepreg. Furthermore, the reinforcement material is selectively treated with a silane coupling agent or a silane coupling agent in order to undergo pretreatment. For example, the reinforcement material is a glass fabric pretreated with a silane coupling agent.

The aforesaid prepreg is heated up at a high temperature or heated at a high temperature and a high pressure to be cured and become a prepreg or a solid-state insulating layer. If the halogen-free resin composition comprises a solvent, the solvent vaporizes during a high-temperature heating process and vanishes.

A further objective of the present invention is to provide a copper clad laminate. The copper clad laminate has a low dielectric characteristic, heat resistant fire resistance, low hygroscopicity, and halogen-free characteristics, and is especially applicable to a circuit board for use in high-speed high-frequency signal transmission. Accordingly, the present invention provides a copper clad laminate that comprises two or more copper foils and at least one insulating layer. The copper foils are made of a copper alloy that contains aluminum, nickel, platinum, silver, and/or gold. The insulating layer is formed by curing the aforesaid prepreg at a high temperature and a high pressure. For example, the aforesaid prepreg is sandwiched between the two copper foils, and then the two copper foils and the prepreg therebetween are laminated together at a high temperature and a high pressure.

The copper clad laminates of the present invention have at least one of the following advantages: a low dielectric constant (Dk) and a low dielectric dissipation factor; excellent heat resistance and fire resistance; low hygroscopicity; high thermal conductivity; and being environmentally friendly by being halogen-free. The copper clad laminates are further processed by circuit-making process to become a circuit board. After electronic components have been mounted on the circuit board, the circuit board and the electronic components thereon can operate well in an adverse environment, such as a high temperature and a high humidity, without having their performance compromised.

A further objective of the present invention is to provide a printed circuit board. The printed circuit board has a low dielectric characteristic, heat resistant fire resistance, low hygroscopicity, and halogen-free characteristics, and is applicable to high-speed high-frequency signal transmission. The circuit board comprises at least one aforesaid copper clad laminate and is manufactured by a conventional process.

The present invention is disclosed below by several preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention.

DETAILED DESCRIPTION OF THE PREFERRED EMBODIMENTS

Objectives, features, and advantages of the present invention are hereunder illustrated with specific embodiments.

The resin compositions in embodiments 1 through 7 are enumerated in Table 1. The resin compositions in comparisons 1 through 5 are enumerated in Table 3.

Embodiment 1 (E1)
A resin composition, comprising the following ingredients:
(A) 80 parts by weight of dicyclopentadiene (DCPD) epoxy resin (HP-7200);
(B) 20 parts by weight of diphenyl epoxy resin (NC-3000);
(C) 35 parts by weight of dicyclopentadiene phenol novolac resin (SD-1809);
(D) 50 parts by weight of benzoxazine resin (LZ 8280);
(E) 15 parts by weight of styrene-maleic anhydride copolymer (EF-40);
(F) 50 parts by weight of phosphazene compound (SPB-100);
(G) 50 parts by weight of molten silicon dioxide (Fused silica);
(H) 0.3 part by weight of catalyst (2E4MI); and
(I) 60 parts by weight of methyl ethyl ketone solvent (MEK).

Embodiment 2 (E2)
A resin composition, comprising the following ingredients:
(A) 80 parts by weight of dicyclopentadiene (DCPD) epoxy resin (HP-7200);
(B) 20 parts by weight of diphenyl epoxy resin (NC-3000);
(C) 36 parts by weight of dicyclopentadiene phenol novolac resin (SD-1809);
(D) 50 parts by weight of benzoxazine resin (LZ 8280);
(E) 5 parts by weight of styrene-maleic anhydride copolymer (EF-40);
(F) 50 parts by weight of phosphazene compound (SPB-100);
(G) 50 parts by weight of molten silicon dioxide;
(H) 0.3 part by weight of catalyst (2E4MI); and
(I) 60 parts by weight of methyl ethyl ketone solvent (MEK).

Embodiment 3 (E3)
A resin composition, comprising the following ingredients:
(A) 80 parts by weight of dicyclopentadiene (DCPD) epoxy resin (HP-7200);
(B) 20 parts by weight of diphenyl epoxy resin (NC-3000);
(C) 40 parts by weight of dicyclopentadiene phenol novolac resin (SD-1809);
(D) 5 parts by weight of benzoxazine resin (LZ 8280);
(E) 40 parts by weight of styrene-maleic anhydride copolymer (EF-40);
(F) 50 parts by weight of phosphazene compound (SPB-100);
(G) 50 parts by weight of molten silicon dioxide;
(H) 0.3 part by weight of catalyst (2E4MI); and
(I) 60 parts by weight of methyl ethyl ketone (MEK) solvent.

Embodiment 4 (E4)
A resin composition, comprising the following ingredients:
(A) 80 parts by weight of dicyclopentadiene (DCPD) epoxy resin (HP-7200);
(B) 20 parts by weight of diphenyl epoxy resin (NC-3000);
(C) 5 parts by weight of dicyclopentadiene phenol novolac resin (SD-1809);
(D) 80 parts by weight of benzoxazine resin (LZ 8280);
(E) 25 parts by weight of styrene-maleic anhydride copolymer (EF-40);
(F) 50 parts by weight of phosphazene compound (SPB-100);
(G) 50 parts by weight of molten silicon dioxide;
(H) 0.3 part by weight of catalyst (2E4MI); and
(I) 60 parts by weight of methyl ethyl ketone (MEK) solvent.

Embodiment 5 (E5)
A resin composition, comprising the following ingredients:
(A) 80 parts by weight of dicyclopentadiene (DCPD) epoxy resin (HP-7200);
(B) 20 parts by weight of diphenyl epoxy resin (NC-3000);
(C) 95 parts by weight of dicyclopentadiene phenol novolac resin (SD-1809);
(D) 10 parts by weight of benzoxazine resin (LZ 8280);
(E) 10 parts by weight of styrene-maleic anhydride copolymer (EF-40);
(F) 50 parts by weight of phosphazene compound (SPB-100);
(G) 50 parts by weight of molten silicon dioxide;
(H) 0.3 part by weight of catalyst (2E4MI); and
(I) 60 parts by weight of methyl ethyl ketone (MEK) solvent.

Embodiment 6 (E6)
A resin composition, comprising the following ingredients:
(A) 80 parts by weight of dicyclopentadiene (DCPD) epoxy resin (HP-7200);
(B) 20 parts by weight of diphenyl epoxy resin (NC-3000);
(C) 10 parts by weight of dicyclopentadiene phenol novolac resin (SD-1809);
(D) 105 parts by weight of benzoxazine resin (LZ 8280);
(E) 10 parts by weight of styrene-maleic anhydride copolymer (EF-40);
(F) 50 parts by weight of phosphazene compound (SPB-100);
(G) 50 parts by weight of molten silicon dioxide;
(H) 0.3 part by weight of catalyst (2E4MI); and
(I) 60 parts by weight of methyl ethyl ketone (MEK) solvent.

Embodiment 7 (E7)
A resin composition, comprising the following ingredients:
(A) 80 parts by weight of dicyclopentadiene (DCPD) epoxy resin (HP-7200);
(B) 20 parts by weight of diphenyl epoxy resin (NC-3000);
(C) 10 parts by weight of dicyclopentadiene phenol novolac resin (SD-1809);
(D) 10 parts by weight of benzoxazine resin (LZ 8280);
(E) 105 parts by weight of styrene-maleic anhydride copolymer (EF-40);
(F) 50 parts by weight of phosphazene compound (SPB-100);
(G) 50 parts by weight of molten silicon dioxide;
(H) 0.3 part by weight of catalyst (2E4MI); and
(I) 60 parts by weight of methyl ethyl ketone (MEK) solvent.

Comparison 1 (C1)
A resin composition, comprising the following ingredients:
(A) 80 parts by weight of dicyclopentadiene (DCPD) epoxy resin (HP-7200);
(B) 20 parts by weight of diphenyl epoxy resin (NC-3000);
(C) 60 parts by weight of benzoxazine resin (LZ 8280);
(D) 40 parts by weight of styrene-maleic anhydride copolymer (EF-40);
(E) 50 parts by weight of phosphazene compound (SPB-100);
(F) 50 parts by weight of molten silicon dioxide;
(G) 0.3 part by weight of catalyst (2E4MI); and
(H) 60 parts by weight of methyl ethyl ketone (MEK) solvent.

Comparison 2 (C2)
A resin composition, comprising the following ingredients:
(A) 80 parts by weight of dicyclopentadiene (DCPD) epoxy resin (HP-7200);
(B) 20 parts by weight of diphenyl epoxy resin (NC-3000);
(C) 40 parts by weight of dicyclopentadiene phenol novolac resin (SD-1809);
(D) 50 parts by weight of benzoxazine resin (LZ 8280);
(E) 50 parts by weight of phosphazene compound (SPB-100);
(F) 50 parts by weight of molten silicon dioxide;
(G) 0.3 part by weight of catalyst (2E4MI); and
(H) 60 parts by weight of methyl ethyl ketone (MEK) solvent.

Comparison 3 (C3)
A resin composition, comprising the following ingredients:
(A) 80 parts by weight of dicyclopentadiene (DCPD) epoxy resin (HP-7200);
(B) 20 parts by weight of diphenyl epoxy resin (NC-3000);
(C) 50 parts by weight of dicyclopentadiene phenol novolac resin (SD-1809);
(D) 40 parts by weight of styrene-maleic anhydride copolymer (EF-40);
(E) 50 parts by weight of phosphazene compound (SPB-100);
(F) 50 parts by weight of molten silicon dioxide;
(G) 0.3 part by weight of catalyst (2E4MI); and
(H) 60 parts by weight of methyl ethyl ketone (MEK) solvent.

Comparison 4 (C4)
A resin composition, comprising the following ingredients:
(A) 80 parts by weight of dicyclopentadiene (DCPD) epoxy resin (HP-7200);
(B) 20 parts by weight of diphenyl epoxy resin (NC-3000);
(C) 10 parts by weight of dicyclopentadiene phenol novolac resin (SD-1809);
(D) 10 parts by weight of benzoxazine resin (LZ 8280);
(E) 10 parts by weight of styrene-maleic anhydride copolymer (EF-40);
(F) 50 parts by weight of phosphazene compound (SPB-100);
(G) 50 parts by weight of molten silicon dioxide;
(H) 0.3 part by weight of catalyst (2E4MI); and
(I) 60 parts by weight of methyl ethyl ketone (MEK) solvent.

Comparison 5 (C5)
A resin composition, comprising the following ingredients:
(A) 80 parts by weight of dicyclopentadiene (DCPD) epoxy resin (HP-7200);
(B) 20 parts by weight of diphenyl epoxy resin (NC-3000);
(C) 10 parts by weight of benzoxazine resin (LZ 8280);
(D) 10 parts by weight of styrene-maleic anhydride copolymer (EF-40);
(E) 50 parts by weight of molten silicon dioxide;
(F) 0.3 part by weight of catalyst (2E4MI); and
(G) 60 parts by weight of methyl ethyl ketone (MEK) solvent.

The resin compositions of embodiments 1 through 7 and comparisons 1 through 5 are evenly mixed in a mixing tank by batch before being transferred to an impregnation tank. Then, a glass fabric is passed through the impregnation tank to allow the resin composition to be attached to the passing glass fabric. Afterward, the resin composition-coated glass-fabric is baked and semi-cured to become a prepreg.

Take four pieces of prepreg from the same batch and two pieces of 18-μm copper foils and stack them in the order of a copper foil, four pieces of prepreg, a copper foil. Then, the two copper foils and the prepreg therebetween are laminated together in a vacuum condition and at 220° C. for two hours to form a copper clad laminate, wherein the four pieces of prepreg are cured to form an insulating layer between the two copper foils.

A physical properties measurement process is performed on the non-copper-containing substrate of the etched aforesaid copper clad laminates and copper foils. The physical properties measurement process measures the glass transition temperature Tg, copper-containing substrate heat resistance (T288), copper-containing substrate immersion tin test (solder dip 288° C., 10 seconds, testing heat resistance, S/D), immersion tin test (pressure cooking at 121° C. for one hour, testing solder dip at 288° C. for 20 seconds, then inspecting for board rupture, PCT) after non-copper-containing substrate PCT absorbing moisture, the tension between the copper foil and the substrate (peeling strength, half ounce copper foil, P/S), dielectric constant (Dk) (wherein Dk is the lower the better), dielectric dissipation factor (wherein Df is the lower the better), non-flammability (flaming test, UL94, wherein grading is performed according to V-0>V-1>V-2). The results of measurement of the resin compositions of embodiments 1 through 7 are shown in Table 2. The results of measurement of the resin compositions of comparisons 1 through 5 are shown in Table 4.

TABLE 1

| ingredients | | E1 | E2 | E3 | E4 | E5 | E6 | E7 |
|---|---|---|---|---|---|---|---|---|
| epoxy resin | HP-7200 | 80 | 80 | 80 | 80 | 80 | 80 | 80 |
| | NC-3000 | 20 | 20 | 20 | 20 | 20 | 20 | 20 |
| DCPD phenol novolac resin | SD-1809 | 35 | 36 | 40 | 5 | 95 | 10 | 10 |
| benzoxazine resin | LZ 8280 | 50 | 50 | 5 | 80 | 10 | 105 | 10 |
| SMA copolymer | EF-40 | 15 | 5 | 40 | 25 | 10 | 10 | 105 |
| flame retardant | SPB-100 | 50 | 50 | 50 | 50 | 50 | 50 | 50 |
| inorganic filler | Fused silica | 50 | 50 | 50 | 50 | 50 | 50 | 50 |
| catalyst | 2E4MI | 0.3 | 0.3 | 0.3 | 0.3 | 0.3 | 0.3 | 0.3 |
| solvent | MEK | 60 | 60 | 60 | 60 | 60 | 60 | 60 |

TABLE 2

| property test | test parameter | E1 | E2 | E3 | E4 | E5 | E6 | E7 |
|---|---|---|---|---|---|---|---|---|
| Tg | DSC | 152 | 152 | 153 | 145 | 162 | 147 | 167 |
| T288 (clad) | TMA (min) | >60 | >60 | >60 | >60 | 25 | 27 | >60 |
| S/D | dip cycles | >20 | >20 | >20 | 15 | >20 | 18 | 10 |
| PCT (1 hr) | dip 288° C., 20 s | Pass | Pass | Pass | Pass | Fail | Fail | Fail |
| P/S | Hoz Cu foil | 6.1 | 6.1 | 5.2 | 5.7 | 6.9 | 7.1 | 5.0 |
| Dk | 1 GHz | 4.01 | 4.31 | 3.95 | 4.05 | 4.23 | 4.21 | 3.82 |
| Df | 1 GHz | 0.009 | 0.009 | 0.013 | 0.008 | 0.012 | 0.007 | 0.012 |
| Flaming test | UL94 | V-0 | V-0 | V-0 | V-0 | V-0 | V-0 | V-0 |
| other | PP appearance | flat | flat | flat | flat | flat | flat | coarse |

Embodiment 1 is about the halogen-free composition of the present invention. Embodiment 1 is compared with embodiments 2, 7. In embodiment 2, the quantity of styrene-maleic anhydride copolymer in inadequate, thus resulting in an overly high dielectric constant (Dk). In embodiment 7, there are too much styrene-maleic anhydride copolymer, thus resulting in poor PP appearance, unsatisfactory physical properties, and unsatisfactory dielectric properties.

Embodiment 1 is compared with embodiments 3, 6. In embodiment 3, there is too little benzoxazine resin, thus resulting in low tension and high dielectric dissipation factor. In embodiment 6, there is too much benzoxazine resin, thus resulting in unsatisfactory heat resistance.

Embodiment 1 is compared with embodiments 4, 5. In embodiment 4, there is inadequate dicyclopentadiene phenol novolac resin, thus resulting in an overly low tension and unsatisfactory heat resistance. In embodiment 5, there is too much dicyclopentadiene phenol novolac resin, thus resulting in unsatisfactory dielectric properties and unsatisfactory heat resistance.

TABLE 3

| ingredients | | C1 | C2 | C3 | C4 | C5 |
|---|---|---|---|---|---|---|
| epoxy resin | HP-7200 | 80 | 80 | 80 | 80 | 80 |
| | NC-3000 | 20 | 20 | 20 | 20 | 20 |
| DCPD phenol novolac resin | SD-1809 | — | 40 | 50 | 10 | — |
| benzoxazine resin | LZ 8280 | 60 | 50 | — | 10 | 10 |
| SMA copolymer | EF-40 | 40 | — | 40 | 10 | 10 |
| flame retardant | SPB-100 | 50 | 50 | 50 | 50 | — |
| inorganic filler | Fused silica | 50 | 50 | 50 | 50 | 50 |
| catalyst | 2E4MI | 0.3 | 0.3 | 0.3 | 0.3 | 0.3 |
| solvent | MEK | 60 | 60 | 60 | 60 | 60 |

TABLE 4

| property test | test parameter | C1 | C2 | C3 | C4 | C5 |
|---|---|---|---|---|---|---|
| Tg | DSC | 143 | 153 | 154 | 147 | 142 |
| T288 (clad) | TMA (min) | >60 | >60 | >60 | >60 | 24 |
| S/D | dip cycles | >20 | >20 | >20 | >20 | 8 |
| PCT(1 hr) | dip 288° C., 20 s | Pass | Pass | Pass | Pass | Fail |
| P/S | Hoz Cu foil | 5.6 | 6.3 | 6.4 | 5.7 | 5.4 |
| Dk | 1 GHz | 3.94 | 4.33 | 3.95 | 4.21 | 4.22 |
| Df | 1 GHz | 0.009 | 0.009 | 0.014 | 0.012 | 0.012 |
| flaming test | UL94 | V-0 | V-0 | V-0 | V-0 | V-2 |
| other | PP appearance | flat | flat | flat | flat | flat |

Embodiment 1 is compared with comparisons 1 through 5. Comparison 1 lacks dicyclopentadiene phenol novolac resin, thereby resulting in unsatisfactory tension and a low glass transition temperature Tg. Comparison 2 lacks styrene-maleic anhydride copolymer, thus resulting in an overly high dielectric constant (Dk). Comparison 3 lacks benzoxazine resin, thus resulting in an overly high dielectric dissipation factor. Comparison 5 lacks dicyclopentadiene phenol novolac resin and flame retardant, thereby resulting in unsatisfactory physical properties, unsatisfactory heat resistance, unsatisfactory non-flammability, and unsatisfactory dielectric properties.

As described above, the present invention meets the three requirements of patentability, namely novelty, non-obviousness, and industrial applicability. Regarding novelty and non-obviousness, the halogen-free resin composition of the present invention features specific ingredients and proportions thereof to attain low dielectric constant (Dk), low dielectric dissipation factor, high heat resistance and high non-flammability and produce prepregs or resin film, and is thus applicable to copper clad laminates and printed circuit boards. Regarding industrial applicability, products derived from the present invention meet market demands fully.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A halogen-free resin composition, comprising:
   (A) 100 parts by weight of epoxy resin, wherein the epoxy resin is at least one selected from the group consisting of phenol novolac epoxy resin, dicyclopentadiene epoxy resin and biphenyl novolac epoxy resin or their combination;
   (B) 20 to 50 parts by weight of benzoxazine resin, wherein the benzoxazine resin is bisphenol A benzoxazine resin, bisphenol F benzoxazine resin, or their combination;
   (C) 15 to 60 parts by weight of styrene-maleic anhydride copolymer, wherein a styrene to maleic anhydride ratio of the styrene-maleic anhydride copolymer is selected from 3/1, 4/1 or their combination; and
   (D) 15 to 90 parts by weight of dicyclopentadiene phenol novolac resin.

2. The composition of claim 1, further comprising a halogen-free flame retardant being at least one selected from the group consisting of bisphenol diphenyl phosphate, ammonium poly-phosphate, hydroquinone bis-(diphenyl phosphate), bisphenol A bis-(diphenylphosphate), tri(2-carboxyethyl)phosphine (TCEP), tris(chloroisopropyl) phosphate, trimethyl phosphate (TMP), dimethyl methyl phosphonate (DMMP), resorcinol dixylenyl phosphate (RDXP), phosphazene, m-phenylene methylphosphonate (PMP), melamine polyphosphate, melamine cyanurate, tri-hydroxy ethyl isocyanurate, 9,10-dihydro-9-oxa-10-phosphaphenanthrene-10-oxide (DOPO), DOPO-containing phenol resin, DOPO-containing epoxy resin, and DOPO-HQ epoxy resin.

3. The composition of claim 1, further comprising at least one selected from the group consisting of an inorganic filler, a curing accelerator, a silane coupling agent, a toughening agent, and a solvent.

4. The composition of claim 1, further comprising at least one selected from the group consisting of phenol resin, phenol novolac resin, polyphenylene ether resin, cyanate ester resin, isocyanate ester resin, maleimide, polyester resin, styrene resin, butadiene resin, phenoxy resin, polyamide, polyimide, and modified derivatives thereof.

5. A prepreg made from the composition of claim 1 and a reinforcement material.

6. A copper clad laminate made from the prepreg of claim 5 and at least one copper foil.

7. A printed circuit board comprising the copper clad laminate of claim 6.

* * * * *